United States Patent
Li et al.

(10) Patent No.: US 12,550,489 B2
(45) Date of Patent: Feb. 10, 2026

(54) MICRO LIGHT-EMITTING DIODE AND LIGHT-EMITTING DEVICE INCLUDING THE SAME

(71) Applicant: XIAMEN SAN'AN OPTOELECTRONICS TECHNOLOGY CO., LTD., Xiamen (CN)

(72) Inventors: Shuiqing Li, Xiamen (CN); Weihua Du, Xiamen (CN); Chaohsu Lai, Xiamen (CN); Heqing Deng, Xiamen (CN)

(73) Assignee: HUBEI SAN'AN OPTOELECTRONICS CO., LTD., Hubei (CN)

( * ) Notice: Subject to any disclaimer, the term of this patent is extended or adjusted under 35 U.S.C. 154(b) by 491 days.

(21) Appl. No.: 18/085,993

(22) Filed: Dec. 21, 2022

(65) Prior Publication Data
US 2023/0127640 A1   Apr. 27, 2023

Related U.S. Application Data

(63) Continuation-in-part of application No. PCT/CN2020/112656, filed on Aug. 31, 2020.

(51) Int. Cl.
*H10H 20/825* (2025.01)
*H10H 20/81* (2025.01)
(Continued)

(52) U.S. Cl.
CPC ........ *H10H 20/825* (2025.01); *H10H 20/811* (2025.01); *H10H 20/816* (2025.01); *H10H 20/8215* (2025.01)

(58) Field of Classification Search
CPC . H10H 20/811; H10H 20/816; H10H 20/8215
See application file for complete search history.

(56) References Cited

U.S. PATENT DOCUMENTS

2012/0261687 A1   10/2012 Shim et al.

FOREIGN PATENT DOCUMENTS

| CN | 107819058 A | 3/2018 | |
|----|-------------|--------|---|
| CN | 110635004 A | * 12/2019 | |
| CN | 110911534 A | * 3/2020 | ........... H01L 33/385 |

OTHER PUBLICATIONS

International Search Report PCT/ISA/210 issued to PCT application No. PCT/CN2020/112656 on May 28, 2021.

* cited by examiner

*Primary Examiner* — Zandra V Smith
*Assistant Examiner* — Molly K Reida
(74) *Attorney, Agent, or Firm* — MUNCY, GEISSLER, OLDS & LOWE, P.C.

(57) ABSTRACT

A micro light-emitting diode (LED) includes an n-type layer, a transitional unit, a light-emitting unit disposed on the transitional unit, and a p-type layer disposed on the light-emitting unit. The transitional unit includes a first transitional layer, a second transitional layer and a third transitional layer that are sequentially disposed on the n-type layer in such order. The n-type layer, the first transitional layer, the second transitional layer, the third transitional layer and the light-emitting unit respectively have a bandgap of $Eg_n$, a bandgap of $Eg_1$, a bandgap of $Eg_2$, a bandgap of $Eg_3$ and a bandgap of $Eg_a$ which satisfy a relationship of $Eg_n \geq Eg_1 > Eg_2 > Eg_3 > Eg_a$.

17 Claims, 4 Drawing Sheets

(51) Int. Cl.
*H10H 20/811* (2025.01)
*H10H 20/816* (2025.01)

MICRO LIGHT-EMITTING DIODE AND LIGHT-EMITTING DEVICE INCLUDING THE SAME

CROSS-REFERENCE TO RELATED APPLICATION

This application is a continuation-in-part (CIP) of International Application No. PCT/CN2020/112656, entitled "Micro-light-emitting diode," filed on Aug. 31, 2020. The entire content of the international patent application is incorporated herein by reference.

FIELD

The disclosure relates to a micro light-emitting diode and a light-emitting device.

BACKGROUND

For micro light-emitting diodes that are applied in display devices (e.g., mobile phones), and wearable devices (e.g., watches or bracelets), a driving current thereof is usually in nano-ampere (nA) level, and has a current density ranging from 0 to 1 A/cm$^2$, even lower to 0 to 0.1 A/cm$^2$.

Referring to FIG. 1, a conventional micro LED includes a substrate 91, and a nucleation layer 92, an undoped layer 93, an n-type layer 94, a transitional layer 96, a light-emitting unit 98 and a p-type layer 99, a p-type AlGaN layer 90, and a p-type GaN layer 911 that are sequentially disposed on the substrate 91 in such order. The transitional layer 96 includes a plurality of pairs of InGaN sublayers and GaN sublayers that are alternately stacked. A wall-plug efficiency (WPE) of the conventional light-emitting diode usually reaches a peak value at a current density of not less than 0.5 A/cm$^2$. When the current density of the light emitting diode is less than 0.1 A/cm$^2$, the wall-plug efficiency is quite unstable and might rapidly descend with little variation of current density, resulting in the conventional light-emitting diode not able to be applied in devices that operate at low current density. Therefore, for the application in mobile phones, smartwatches, or smart bracelets, etc., there is still a need to develop a micro light-emitting diode having a steady wall-plug efficiency that can reach peak value at a relatively low current density.

SUMMARY

Therefore, an object of the disclosure is to provide micro light-emitting diodes and a light-emitting device that can alleviate at least one of the drawbacks of the prior art.

In a first aspect of the disclosure, the micro light-emitting diode (LED) includes an n-type layer, a transitional unit, a light-emitting unit and a p-type layer. The transitional unit includes a first transitional layer, a second transitional layer and a third transitional layer that are sequentially disposed on the n-type layer in such order. The n-type layer, the first transitional layer, the second transitional layer, the third transitional layer and the light-emitting unit respectively have a bandgap of $Eg_n$, a bandgap of $Eg_1$, a bandgap of $Eg_2$, a bandgap of $Eg_3$ and a bandgap of $Eg_a$ which satisfy a relationship of $Eg_n \geq Eg_1 > Eg_2 > Eg_3 > Eg_a$.

In a second aspect of the disclosure, the micro LED includes a substrate, and an undoped layer, an n-type layer, a transitional unit, a light-emitting unit, and a p-type layer that are disposed on the substrate in such order. The transitional unit has a first thickness, the light-emitting unit has a second thickness that is smaller than the first thickness, and a ratio of the first thickness to the second thickness is greater than 5 and not greater than 150.

In a third aspect of the disclosure, the light-emitting device includes at least one micro LED as described above.

BRIEF DESCRIPTION OF THE DRAWINGS

Other features and advantages of the disclosure will become apparent in the following detailed description of the embodiments with reference to the accompanying drawings. It is noted that various features may not be drawn to scale.

DETAILED DESCRIPTION

Figure 1:
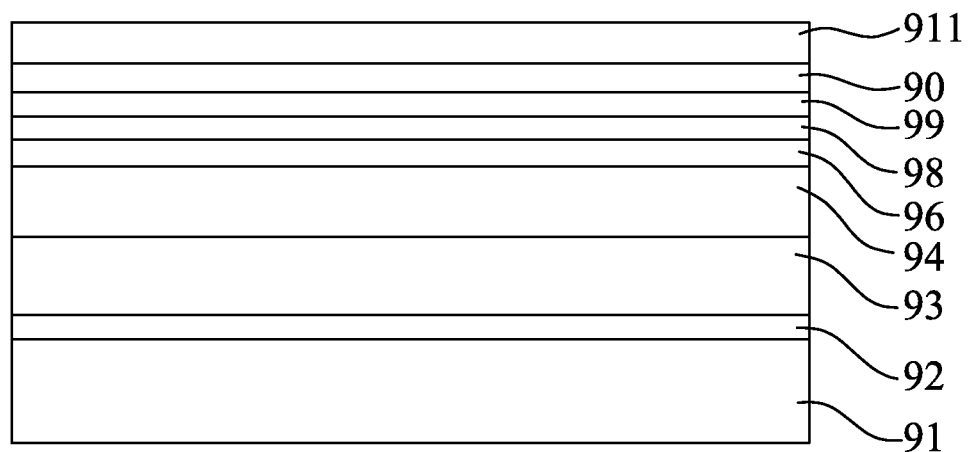
FIG. 1 is a schematic view illustrating a conventional micro light-emitting diode (LED).

Before the disclosure is described in greater detail, it should be noted that where considered appropriate, reference numerals or terminal portions of reference numerals have been repeated among the figures to indicate corresponding or analogouss elements, which may optionally have similar characteristics.

It should be noted herein that for clarity of description, spatially relative terms such as "top," "bottom," "upper," "lower," "on," "above," "over," "under," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
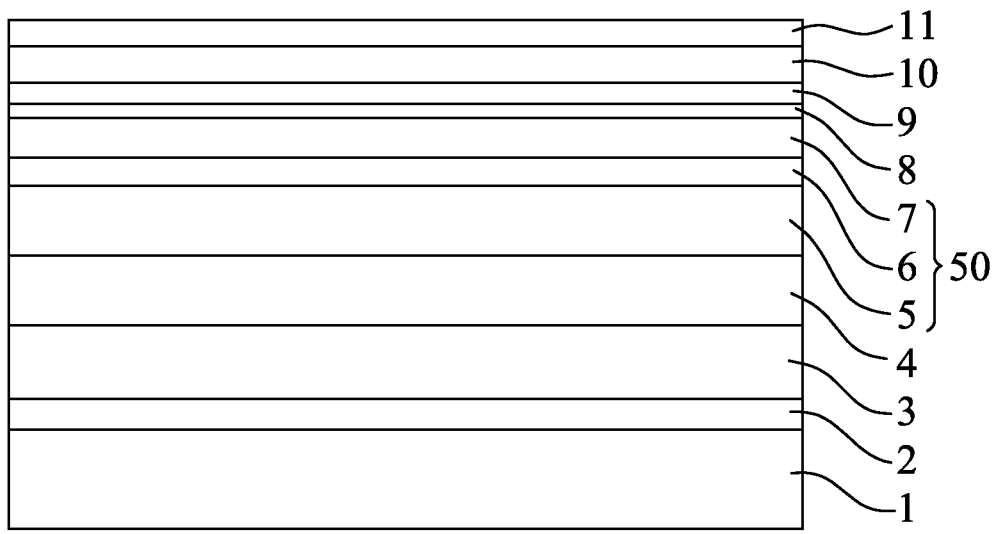
FIG. 2 is a schematic view illustrating a first embodiment of a micro LED according to the present disclosure.

Referring to FIG. 2, a first embodiment of a micro light-emitting diode (LED) of the present disclosure includes a substrate 1, a nucleation layer 2, an undoped GaN layer 3, an n-type GaN layer 4, a transitional unit 50, a light-emitting unit 8, a p-type layer 9, a p-type AlGaN layer 10 and a p-type GaN layer 11 that are sequentially disposed on one another in such order. The transitional unit 50 includes a first transitional layer 5, a second transitional layer 6 and a third transitional layer 7. The n-type GaN layer 4, the first transitional layer 5, the second transitional layer 6, the third transitional layer 7 and the light-emitting unit 8 respectively have a bandgap of $Eg_n$, a bandgap of $Eg_1$, a bandgap of $Eg_2$, a bandgap of $Eg_3$ and a bandgap of $Eg_a$ which satisfy a relationship of $Eg_n \geq Eg_1 > Eg_2 > Eg_3 > Eg_a$.

A method for manufacturing the first embodiment of the micro LED includes the following steps.

In step (a), the substrate 1 is first provided. The substrate 1 may be made of sapphire, gallium (III) oxide, silicon carbide, gallium nitride, zinc oxide, silicon, germanium, or combinations thereof. The substrate 1 may have a surface that is flat or formed with a patterned structure. In some embodiments, an aluminum nitride layer or a silicon nitride layer is further formed on the surface of the substrate 1, through e.g., a deposition process. In this embodiment, the substrate 1 is a sapphire substrate, and the aluminum nitride layer is formed on a flat surface of the sapphire substrate.

In step (b), the nucleation layer 2 is epitaxially grown on the substrate 1. In some embodiments, the nucleation layer 2 is made of AlGaN or GaN. Examples of the process for epitaxially growing the nucleation layer 2 include, but are not limited to, metal-organic chemical vapor deposition (MOCVD), molecular beam epitaxy (MBE), chemical vapor deposition (CVD), hydride vapor phase epitaxy (HVPE), and plasma enhanced chemical vapor deposition (PECVD).

In this embodiment, the nucleation layer 2 is formed using MOCVD. Specifically, the substrate 1 is placed on a plate in a MOCVD reaction chamber, and is then subjected to a hydrogenation process to remove impurities on the substrate 1. After a temperature of the plate is adjusted to a temperature ranging from about 500° C. to 600° C., the nucleation layer 2 having a thickness ranging from about 5 nm to 30 nm is formed on the substrate 1.

In step (c), the undoped GaN layer 3 and the n-type GaN layer 4 are epitaxially grown on the nucleation layer 2 in such order. The undoped GaN layer 3 may have a thickness ranging from about 1 µm to 4 µm, so as to reduce dislocation defect between the layers disposed on two opposite sides of the undoped GaN layer 3, i.e., the nucleation layer 2 and the n-type GaN layer 4. The n-type GaN layer 4 may have a thickness ranging from about 1 µm to 4 µm, and may have a doping concentration ranging from $1\times10^{17}$ cm$^{-3}$ to $5\times10^{19}$ cm$^{-3}$. The n-type GaN layer 4 is configured to provide electrons for radiative combination in the light-emitting unit 8.

In step (d), the first transitional layer 5 is grown on the n-type GaN layer 4 through e.g., MOCVD, after the plate in the MOCVD reaction chamber is adjusted to a temperature ranging from about 750° C. to 1000° C.

The first transitional layer 5 may be made of a material represented by $Al_aIn_bGa_{(1-a-b)}N$, where 0≤a<1, and 0≤b≤1, and may have a thickness ranging from 50 Å to 5000 Å. In some embodiments, the first transitional layer 5 includes 1 to 30 doped semiconductor sublayers that are stacked on one another and that have different doping concentrations. In some embodiments, each of the doped semiconductor sublayers has a doping concentration ranging from $1\times10^{17}$ cm$^{-3}$ to $5\times10^{19}$ cm$^{-3}$. In certain embodiments, each of the doped semiconductor sublayers are independently doped with silicon, or any other suitable dopants. Type of dopant used for each of the doped semiconductor sublayers may be identical or different. Each of the doped semiconductor sublayers may be grown at the same or different growth temperature.

Figure 3:
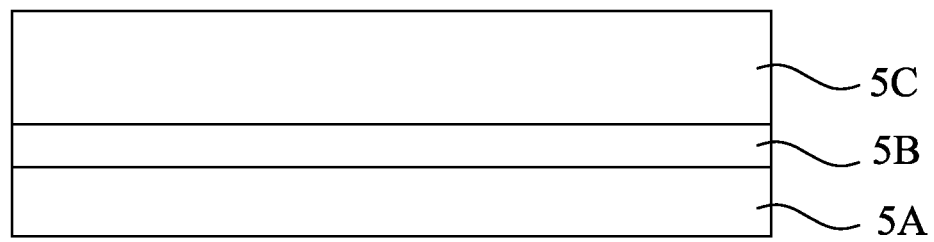
FIG. 3 is a schematic view illustrating a first transitional unit of the first embodiment of the micro LED according to the present disclosure.

Referring to FIG. 3, in this embodiment, the first transitional layer 5 includes a first doped semiconductor sublayer 5A, a second doped semiconductor sublayer 5B, and a third doped semiconductor sublayer 5C that are sequentially grown on the n-type GaN layer 4 in such order. The first doped semiconductor sublayer 5A is made of GaN with a doping concentration ranging from $5\times10^{18}$ cm$^{-3}$ to $5\times10^{19}$ cm$^{-3}$, and has a thickness ranging from 200 Å to 1000 Å.

The second doped semiconductor sublayer 5B is made of GaN with a doping concentration ranging from $5\times10^{17}$ cm$^{-3}$ to $5\times10^{18}$ cm$^{-3}$, and has a thickness ranging from 200 Å to 1000 Å. The third doped semiconductor sublayer 5C is made of GaN with a doping concentration ranging from $5\times10^{17}$ cm$^{-3}$ to $5\times10^{19}$ cm$^{-3}$, and has a thickness ranging from 300 Å to 3000 Å. Each of the first, second and third doped semiconductor sublayers 5A, 5B, 5C are grown at the same growth temperature.

The first transitional layer 5 including multiple sublayers may effectively relieve stress between the layers disposed on two opposite sides of the first transitional layer 5 (i.e., the light-emitting unit 8, and the nucleation layer 2, the undoped GaN layer 3, and the n-type GaN layer 4), thereby reducing dislocation defects therebetween, and thus enhancing crystal quality of the light-emitting unit 8.

In other embodiments, the first transitional layer 5 includes one of the first, second and third doped semiconductor sublayers 5A, 5B, 5C, so as to shorten growth time and enhance production efficiency.

In yet other embodiments, the first transitional layer 5 includes two of the first, second and third doped semiconductor sublayers 5A, 5B, 5C. By maintaining different doping concentrations of the doped semiconductor sublayers, a current spreading effect may be enhanced, thereby improving an electrostatic discharge (ESD) effect of the micro LED produced thereby.

Figure 4:
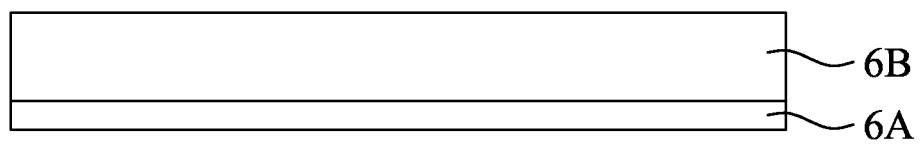
FIG. 4 is a schematic view illustrating a second transitional unit of the first embodiment of the micro LED according to the present disclosure.

In step (e), the second transitional layer 6 is grown on the first transitional layer 5 through e.g., MOCVD, after the plate in the MOCVD reaction chamber is adjusted to a temperature ranging from about 700° C. to 950° C. The second transitional layer 6 may have a thickness ranging from 60 Å to 5000 Å. The second transitional layer 6 may include at least one first stacked structure. Referring to FIG. 4, the first stacked structure may include a first bandgap semiconductor sublayer 6A and a second bandgap semiconductor sublayer 6B that have different bandgaps. In certain embodiment, the first bandgap semiconductor sublayer 6A is made of a material represented by $Al_cIn_dGa_{(1-c-d)}N$, and the second bandgap semiconductor sublayer 6B is made of a material represented by $Al_eIn_fGa_{(1-e-f)}N$, wherein 0≤c<1, 0≤d<1, 0≤e<1, 0≤f<1, d≠f, and when one of c and e is not 0, c≠e. The first bandgap semiconductor sublayer 6A may be unintentionally doped and may have a thickness ranging from 10 Å to 100 Å. The second bandgap semiconductor sublayer 6B may have a doping concentration ranging from $1\times10^{17}$ cm$^{-3}$ to $1\times10^{19}$ cm$^{-3}$, and may have a thickness ranging from 50 Å to 500 Å. Each of the first and second bandgap semiconductor sublayers 6A, 6B may be grown at the same, or different growth temperatures.

A number of the first stacked structure in the second transitional layer 6 may range from 1 to 100, such as 2 to 30. In certain embodiments, there are a plurality of the first stacked structures in the second transitional layer 6, and the first bandgap semiconductor sublayers 6A and the second bandgap semiconductor sublayers 6B are alternately stacked on one another. One of the first stacked structures may have In content that is the same as or different from that of another one of the first stacked structures.

In this embodiment, the second transitional layer 6 includes three first stacked structures having the same bandgap. For each of the first stacked structures, the first bandgap semiconductor sublayer 6A is made of InGaN, and the second bandgap semiconductor sublayer 6B is made of GaN, and is doped with Si at a doping concentration ranging from $5\times10^{17}$ cm$^{-3}$ to $1\times10^{19}$ cm$^{-3}$.

The second transitional layer 6 has a bandgap of $Eg_2$ which is smaller than a bandgap of $Eg_1$ of the first transitional layer 5. Therefore, lattice mismatch between the light-emitting unit 8 having high In content and disposed on the second transitional layer 6 and the layers disposed under the second transitional layer 6 (i.e., the nucleation layer 2, the undoped GaN layer 3 and/or the n-type GaN layer 4) may be further reduced, and crystal quality of the light-emitting unit 8 may be improved.

In step (f), the third transitional layer 7 is grown on the second transitional layer 6. The third transitional layer 7 may have a thickness ranging from 15 Å to 5000 Å. The third transitional layer 7 may include at least one second stacked structure that contains a plurality of semiconductor sublayers having different bandgaps. In certain embodiments, the second stacked structure includes four different semiconductor sublayers, namely a first semiconductor sublayer, a second semiconductor sublayer, a third semiconductor sublayer and a fourth semiconductor sublayer that are sequentially disposed on the second transitional layer 6 in such order. The first semiconductor sublayer may have a thickness ranging from 5 Å to 30 Å, and may be made of a material represented by $Al_m In_n Ga_{(1-m-n)}N$, wherein $0 \leq m < 1$, and $0 \leq n < 1$. The second semiconductor sublayer may have a thickness ranging from 10 Å to 50 Å, and may be made of a material represented by $In_k Ga_{(1-k)}N$, wherein $0 < k < 1$. Each of the third and fourth semiconductor sublayers may be independently made of a material represented by $Al_p In_q Ga_{(1-p-q)}N$, wherein $0 \leq p < 1$, and $0 \leq q < 1$. The third semiconductor sublayer may have a thickness ranging from 10 Å to 50 Å. The fourth semiconductor sublayer may have a thickness ranging from 30 Å to 100 Å.

A number of the second stacked structure ranges from 1 to 50, such as 2 to 30. In some embodiments, the third transitional layer 7 includes a plurality of the second stacked structures. In such case, the second stacked structures may contain a first set proximal to the n-type GaN layer 4, and a second set distal from the n-type GaN layer 4 i.e., proximal to the p-type layer 9 (to be discussed later). A number of the second stacked structures in the first set may range from 1 to 50, and a number of the second stacked structures in the second set may range from 0 to smaller than 50. In some embodiments, each of the second stacked structures in the first and second sets may be doped with, for example, but not limited to, Si. Each of the second stacked structures in the first set may have a first doping concentration (c1) that ranges from $1 \times 10^{17}$ cm$^{-3}$ to $5 \times 10^{18}$ cm$^{-3}$, and each of the second stacked structures in the second set may have a second doping concentration (c2) that ranges from $1 \times 10^{17}$ cm$^{-3}$ to $1 \times 10^{20}$ cm$^{-3}$. The second doping concentration (c2) is not smaller than the first doping concentration (c1). With the stepwise difference of doping concentrations of the second stacked structures in the first and second sets, in cooperation with the light-emitting unit 8 that is unintentionally doped (to be discussed later), a localized distribution of current carriers can be effectively reduced, so that injection of current carriers can be improved, and the current carriers are more evenly distributed, thereby effectively enhancing radiation recombination of the current carriers.

Figure 5:
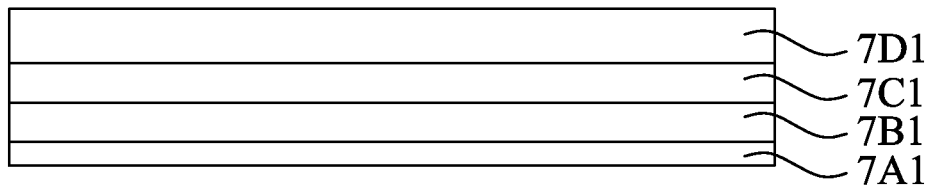
FIGS. 5 and 6 are schematic views illustrating a first set and a second set of second stacked structures in a third transitional unit of the first embodiment of the micro LED according to the present disclosure.

Referring to FIG. 5, in this embodiment, each of the second stacked structures in the first set may include the first semiconductor sublayer 7A1 that is made of unintentionally doped GaN, the second semiconductor sublayer 7B1 that is grown at a temperature lower than that of the first semiconductor sublayer 7A1 and that is made of unintentionally doped InGaN, the third semiconductor sublayer 7C1 that is made of unintentionally doped AlGaN, and the fourth semiconductor sublayer 7D1 that is made of GaN intentionally doped at a doping concentration ranging from $1 \times 10^{17}$ cm$^{-3}$ to $1 \times 10^{18}$ cm$^{-3}$. In this embodiment, the number of the second stacked structures in the first set ranges from 1 to 20.

Figure 6:
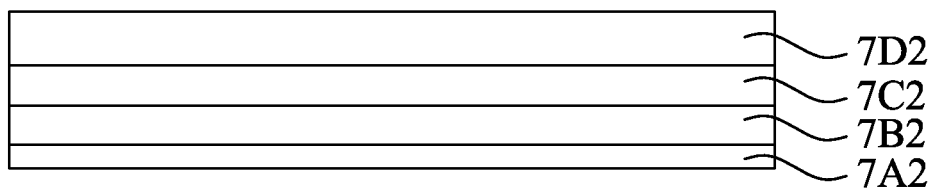

Referring to FIG. 6, in this embodiment, each of the second stacked structures in the second set includes the first, second, third and fourth semiconductor sublayers 7A2, 7B2, 7C2 and 7D2 that are respectively similar to the first, second, third and fourth semiconductor sublayers 7A1, 7B1, 7C1 and 7D1 in the first set, except that the fourth semiconductor sublayer 7D2 of each of the second stacked structures in the second set is intentionally doped at a concentration ranging from $1 \times 10^{18}$ cm$^{-3}$ to $1 \times 10^{19}$ cm$^{-3}$. In this embodiment, the number of the second stacked structures in the first set ranges from 1 to 10.

It should be noted that in this embodiment, each of the second stacked structures in the third transition layer 7 has the same In content, but in other embodiments, the second stacked structures may have different In contents. In addition, each of the second stacked structures in this embodiments has the same bandgap, but the second stacked structures may have different bandgaps in other embodiments. An average bandgap of the second stacked structures in the third transition layer 7 is smaller than an average bandgap of the first stacked structures in the second transitional layer 6. The third transitional layer 7 is configured to further relieve dislocation mismatch between the light-emitting unit 8 having high In content and disposed on the third transitional layer 7 and the layers disposed under the third transitional layer 7 (i.e., the nucleation layer 2, the undoped GaN layer 3 and/or the n-type GaN layer 4), so as to increase crystal quality of the light-emitting unit 8. As such, the micro LED produced therefrom reaches a peak value of wall-plug efficiency at a relatively low current density.

In certain embodiment, some of the second stacked structures of the third transitional layer 7 include two or three of the aforesaid semiconductor sublayers. For example, at least one of the second stacked structures may include only the second and fourth semiconductor sublayers (i.e., omitting the first and third semiconductor sublayers), or only the first and second semiconductor sublayers (i.e., omitting the third and fourth semiconductor sublayers). In other cases, at least one of the second stacked structures may include only the second, third and fourth semiconductor sublayers (i.e., omitting the first semiconductor sublayer), or only the first, third and fourth semiconductor sublayers (i.e., omitting the second semiconductor sublayer). By omitting some of the semiconductor sublayers in the second stacked structures, growth time thereof can be reduced and production efficiency may be improved.

In certain embodiments, each of the aforesaid semiconductor sublayers in the third transitional layer 7 are grown at the same growth temperature. By controlling amounts of In, Al and Ga introduced, the In contents of the second semiconductor sublayers in the second stacked structures may gradually change. Therefore, crystal quality of the light-emitting unit 8 may be enhanced, while the growth time may be reduced, and growth efficiency may be enhanced.

In other embodiments, the first doping concentration (c1) of each of the second stacked structures in the first set is the same as the second doping concentration (c2) of each of the second stacked structures of the second set. When the first doping concentration (c1) and the second doping concentration (c2) are the same and controlled within a range of $1 \times 10^{17}$ cm$^{-3}$ to $5 \times 10^{18}$ cm$^{-3}$, the third transitional layer 7 can cooperate with the light-emitting unit 8 that is highly doped (to be discussed later) to effectively reduce a localized distribution of current carriers, and to improve injection of current carriers.

When the first doping concentration (c1) and the second doping concentration (c2) are the same and controlled within a range of $1\times10^{18}$ cm$^{-3}$ to $1\times10^{19}$ cm$^{-3}$, the third transitional layer 7 may have reduced resistance and a reduced voltage when a current is applied thereto.

In step (g), the light-emitting unit 8 is grown on the third transitional layer 7. The light-emitting unit 8 may have a second thickness (t2) ranging from 50 Å to 2000 Å, such as 50 Å to 1000 Å.

Figure 7:
FIG. 7 is a schematic view illustrating a light-emitting unit of the first embodiment of the micro LED according to the present disclosure.

Referring to FIG. 7, the light-emitting unit 8 includes at least one third stacked structure that is unintentionally doped (i.e., less than $1\times10^{17}$ cm$^{-3}$) and that includes a well layer 8A and a barrier layer 8B. A number of the third stacked structure may range from 1 to 20, such as 3 to 10. In other embodiments, the light-emitting unit 8 further includes at least one fourth stacked structure that contains a well layer and a barrier layer and that is intentionally doped. The fourth stacked structure may have a third doping concentration (c3) ranging from $1\times10^{17}$ cm$^{-3}$ to $1\times10^{20}$ cm$^{-3}$. A number of the fourth stacked structure is not greater than the number of third stacked structure, and may be smaller than 10. A total number of the third and fourth stacked structures may range from 1 to 15.

In some embodiments, the light-emitting unit 8 includes the third stacked structure(s), and does not include the fourth stacked structure. In such case, the second doping concentration (c2) of each of the second stacked structures in the second set is not smaller than the first doping concentration (c1) of each of the second stacked structures in the first set, so as to improve injection of current carriers.

In other embodiments, the light-emitting unit 8 includes the third and fourth stacked structures. In such case, the second doping concentration (c2) is not smaller than the first doping concentration (c1), and is not greater than the third doping concentration (c3). For example, the third doping concentration (c3) may be higher than each of the first and second doping concentrations (c1, c2). Alternatively, the third doping concentration (c3) may be equal to the second doping concentration (c2) and may be greater than the first doping concentration (c1). With the stepwise difference in doping concentration of the light-emitting unit 8 and the transitional unit 50, a localized distribution of current carriers can be effectively reduced, so that injection of current carriers can be improved, and the current carriers are more evenly distributed and have increased lifetime, thereby effectively enhancing radiation recombination of the current carriers. As such, the micro LED of this disclosure may reach a peak value of wall-plug efficiency at a relatively low current density, and exhibits an enhanced light-emitting efficiency at a low current.

In step (h), a p-type layer 9 is grown on the light-emitting unit 8 at a relatively low temperature, so as to protect the multiple quantum well structure of the light-emitting unit 8 from damage at high temperature at which the layer(s) are subsequently formed thereon, and to provide injection of more electron holes.

In step (i), a p-type AlGaN layer 10 and a p-type GaN layer 11 with flat surfaces are sequentially grown on the p-type layer 9 at a relatively high temperature.

In step (j), the resultant epitaxial structure is processed to be formed into a plurality of the micro LEDs, each having a length ranging from 1 μm to 300 μm and a width each ranging from 1 μm to 300 μm. In certain embodiments, each of the micro LEDs may have a size of 89 μm×129 μm. The micro LEDs of the present disclosure may be applied in a light-emitting device, or any other suitable applications.

Figure 8:
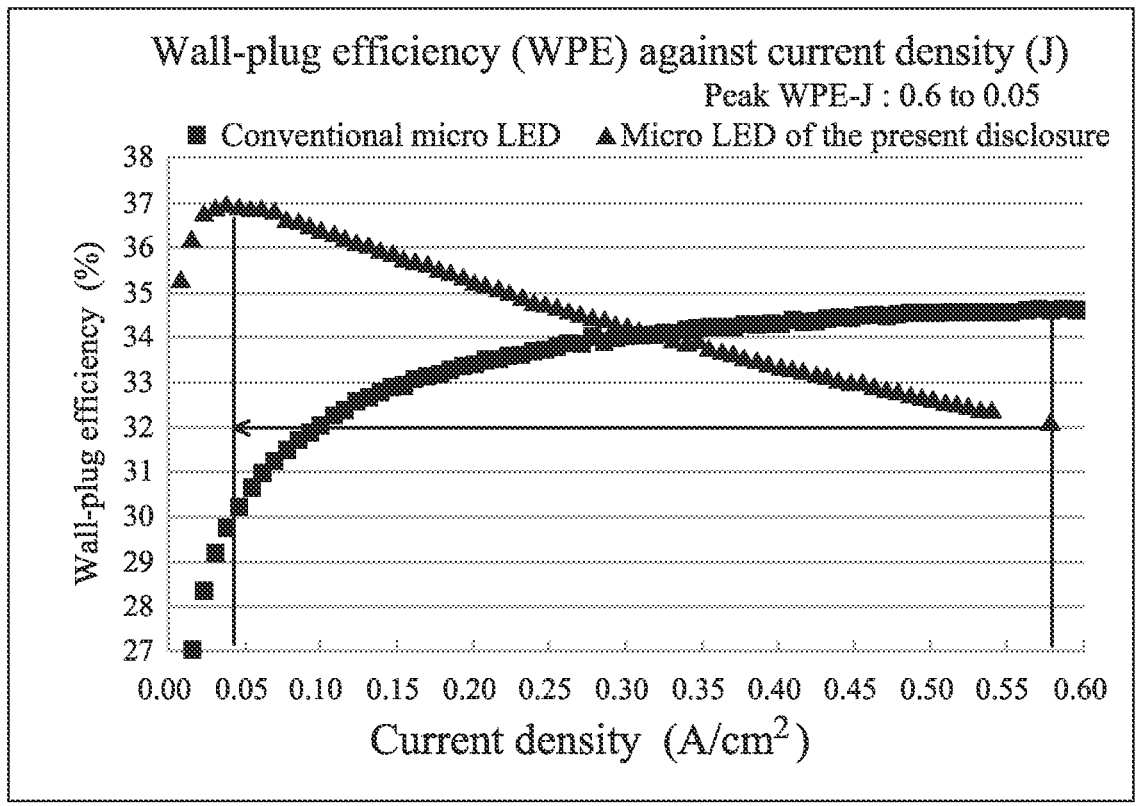
FIG. 8 is a plot of wall-plug efficiency against current density measured in the first embodiment of the micro LED and the conventional micro LED.

A sample of the micro LED of this disclosure is packaged and subjected to a wall-plug efficiency (WPE) test at different current densities. A conventional micro LED shown in FIG. 1 is also subjected to the same test. As shown in FIG. 8, the conventional micro LED reaches a peak WPE at a current density of about 0.6 A/cm$^2$, while the micro LED of the present disclosure reaches a peak WPE at a current density of about 0.05 A/cm$^2$, which is significantly smaller than that of the conventional micro LED. In addition, the peak WPE of the micro LED of the present disclosure is improved by approximately 6% compared to that of the conventional micro LED. Furthermore, at a current density of 0.05 A/cm$^2$, the WPE of the micro LED of the present disclosure is improved by approximately 20% compared to that of the conventional micro LED.

A second embodiment of the micro LED of the present disclosure is similar to the first embodiment, except for the difference in the configuration of the transitional unit 50. Specifically, the transitional unit 50 may include only one or two of the first, second and third transitional layers 5, 6, 7 as discussed in the first embodiment. In this embodiment, the transitional unit 50 includes the second transitional layer 6, which includes a plurality of InGaN sublayers and a plurality of GaN sublayers that are alternately stacked on one another. In addition, a bandgap of the transitional unit 50 is greater than that of the light-emitting unit 8, and is smaller than that of the n-type GaN layer 4. The transitional unit 50 may have a first thickness (t1) ranging from 500 Å to 15000 Å. The light-emitting unit 8 may have a second thickness (t2) ranging from 50 Å to 2000 Å, such as 50 Å to 1000 Å. A ratio of the first thickness (t1) to the second thickness (t2) may be greater than 5 and not greater than 150, such as greater than 5 and not greater than 50. In some embodiments, the ratio of t1 to t2 is greater than 5 and not greater than 20. By adjusting the ratio of t1 to t2, stress due to lattice mismatch between the light-emitting unit 8 and the layers disposed thereunder can be effectively reduced, thereby improving crystal quality of the light-emitting unit 8 and radiative recombination efficiency of holes and electrons. Therefore, the micro LED of this disclosure may exhibit an enhanced light-emitting efficiency under a relatively low current density.

A third embodiment of the micro LED of the present disclosure is similar to the first embodiment, except that in the third embodiment, a ratio of the first thickness (t1) of the transitional unit 50 to the second thickness (t2) of the light-emitting unit 8 is greater than 5 and not greater than 150, such as greater than 5 and not greater than 50, or, greater than 5 and not greater than 20. By adjusting the ratio of t1 to t2, stress due to lattice mismatch between the light-emitting unit 8 and the layers disposed thereunder can be effectively reduced, thereby improving crystal quality of the light-emitting unit 8 and radiative recombination efficiency of holes and electrons. Therefore, the micro LED of this disclosure may exhibit an enhanced light-emitting efficiency under a relatively low current density.

A fourth embodiment of the micro LED of the present disclosure is similar to the first embodiment, except that in the second transitional layer 6 of the fourth embodiment, the In and Al contents of the first stacked structures gradually change (increase or decrease) in a direction away from the substrate 1, so that the average bandgaps of the first stacked structures gradually change (decrease or increase), thereby further reducing stress due to lattice mismatch.

A fifth embodiment of the micro LED of the present disclosure is similar to the first embodiment, except that in the third transitional layer 7 of the fifth embodiment, the In and Al contents of the second stacked structures gradually increase or decrease in a direction away from the substrate 1, so that the average bandgaps of the second stacked structures gradually change (decrease or increase), thereby further reducing stress due to lattice mismatch.

A sixth embodiment of the micro LED of the present disclosure is similar to the first embodiment, except that the second transitional layer 6 and the third transitional layer 7 are those described in the fourth and fifth embodiments.

To conclude, by satisfying the bandgap relationship of $Eg_n \geq Eg_1 > Eg_2 > Eg_3 > Eg_a$, dislocation between the light-emitting unit and the n-type GaN layer is greatly reduced, and stress therebetween is relieved, which is conducive to the improvement of crystal quality of the light-emitting unit. The micro LED of the present disclosure therefore can achieve a peak WPE at a relatively low current density. In addition, by adjusting the ratio of the first thickness (t1) of the transitional unit and the second thickness (t2) of the light-emitting unit, recombination efficiency of holes and electrons increases, and stress due to lattice mismatch between the light-emitting unit and the n-type GaN layer is reduced. Furthermore, by virtue of the transitional unit and the light-emitting unit having stepwise doping concentrations, the localized distribution of current carriers can be effectively reduced, and injection of the current carriers can be improved. That is, the current carriers are more evenly distributed in the micro LED, thereby enhancing recombination efficiency thereof so as to further improve the light emitting efficiency of the micro LED at a relatively low current density.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A micro light-emitting diode (LED), comprising:
   an n-type layer,
   a transitional unit including a first transitional layer, a second transitional layer and a third transitional layer that are sequentially disposed on said n-type layer in such order,
   a light-emitting unit disposed on said transitional unit, and
   a p-type layer disposed on said light-emitting unit,
   wherein said n-type layer, said first transitional layer, said second transitional layer, said third transitional layer and said light-emitting unit respectively have a bandgap of $Eg_n$, a bandgap of $Eg_1$, a bandgap of $Eg_2$, a bandgap of $Eg_3$ and a bandgap of $Eg_a$ which satisfy a relationship of $Eg_n \geq Eg_1 > Eg_2 > Eg_3 > Eg_a$,
   wherein said first transitional layer includes 2 to 30 doped semiconductor sublayers stacked on one another and having different doping concentrations, each of said doped semiconductor sublayers having a doping concentration ranging from $1 \times 10^{17}$ cm$^{-3}$ to $5 \times 10^{19}$ cm$^{-3}$.

2. The micro LED as claimed in claim 1, wherein said first transitional layer has a thickness ranging from 50 Å to 5000 Å, and is made of a material represented by $Al_a In_b Ga_{(1-a-b)}N$, where $0 \leq a < 1$, and $0 \leq b \leq 1$.

3. The micro LED as claimed in claim 1, wherein said second transitional layer includes at least one first stacked structure, said first stacked structure including a first bandgap semiconductor sublayer and a second bandgap semiconductor sublayer that have different bandgaps.

4. The micro LED as claimed in claim 3, wherein said first bandgap semiconductor sublayer is made of a material represented by $Al_c In_d Ga_{(1-c-d)}N$, and said second bandgap semiconductor sublayer is made of a material represented by $Al_e In_f Ga_{(1-e-f)}N$, wherein $0 \leq c < 1$, $0 \leq d < 1$, $0 \leq e < 1$, $0 \leq f < 1$, $d \neq f$, and when one of c and e is not 0, $c \neq e$, said second bandgap semiconductor sublayer having a doping concentration ranging from $1 \times 10^{17}$ cm$^{-3}$ to $1 \times 10^{19}$ cm$^{-3}$.

5. The micro LED as claimed in claim 3, wherein said second transitional layer has a thickness ranging from 60 Å to 5000 Å, and a number of said first stacked structure ranges from 1 to 100.

6. The micro LED as claimed in claim 1, wherein said third transitional layer includes at least one second stacked structure that contains a plurality of semiconductor sublayers having different bandgaps.

7. The micro LED as claimed in claim 6, wherein said third transitional layer has a thickness ranging from 15 Å to 5000 Å, and a number of said second stacked structure ranges from 1 to 50.

8. The micro LED as claimed in claim 6, wherein said third transitional layer includes a plurality of said second stacked structures which contains a first set proximal to said n-type layer and a second set proximal to said p-type layer, wherein each of said second stacked structures in said first set has a first doping concentration ranging from $1 \times 10^{17}$ cm$^{-3}$ to $5 \times 10^{18}$ cm$^{-3}$ and each of said second stacked structures in said second set has a second doping concentration that is not smaller than the first doping concentration, and that ranges from $1 \times 10^{17}$ cm$^{-3}$ to $1 \times 10^{20}$ cm$^{-3}$, and wherein a number of said second stacked structures in said first set ranges from 1 to 50, and a number of said second stacked structures in said second set ranges from 1 to smaller than 50.

9. The micro LED as claimed in claim 6, wherein said semiconductor sublayers include a first semiconductor sublayer that is made of a material represented by $Al_m$ $In_nGa_{(1-m-n)}N$ and a second semiconductor sublayer that is made of a material represented by $In_kGa_{(1-k)}N$, wherein 0<k<1, 0≤m<1, and 0≤n<1.

10. The micro LED as claimed in claim 9, wherein said semiconductor sublayers further include a third semiconductor sublayer and a fourth semiconductor sublayer.

11. The micro LED as claimed in claim 10, wherein each of said third semiconductor sublayer and said fourth semiconductor sublayer is independently made of a material represented by $Al_pIn_qGa_{(1-p-q)}N$, 0≤p<1, and 0≤q<1.

12. The micro LED as claimed in claim 1, wherein said light-emitting unit includes at least one third stacked structure that has a doping concentration less than $1\times10^{17}$ cm$^{-3}$ and that includes a well layer and a barrier layer, a number of said third stacked structure ranging from 1 to 20.

13. The micro LED as claimed in claim 12, wherein said light-emitting unit further includes at least one fourth stacked structure that is intentionally doped and that includes a well layer and a barrier layer and that has a third doping concentration ranging from $1\times10^{17}$ cm$^{-3}$ to $1\times10^{20}$ cm$^{-3}$, and wherein a number of said fourth stacked structure is not greater than the number of third stacked structure and ranges from 1 to smaller than 10.

14. The micro LED as claimed in claim 13, wherein
said third transitional layer includes a plurality of second stacked structures which contains a first set of said second stacked structures proximal to said n-type layer and a second set of said second stacked structures proximal to said p-type layer, and
a number of said second stacked structures in said second set is equal to or greater than 1, and each of said second stacked structures in said first set has a first doping concentration, and each of said second stacked structures in said second set has a second doping concentration that is not smaller than the first doping concentration, and that is not greater than the third doping concentration.

15. The micro LED as claimed in claim 12, wherein
said third transitional layer includes a plurality of second stacked structures which contains a first set of said second stacked structures proximal to said n-type layer and a second set of said second stacked structures proximal to said p-type layer, and
each of said second stacked structures in said first set has a first doping concentration and each of said second stacked structures in said second set has a second doping concentration that is smaller than the first doping concentration.

16. The micro LED as claimed in claim 1, which has a length and a width each ranging from 1 μm to 300 μm.

17. A light-emitting device, comprising a micro LED as claimed in claim 1.

* * * * *